(12) United States Patent
Jones et al.

(10) Patent No.: US 7,944,294 B2
(45) Date of Patent: May 17, 2011

(54) SIGNAL AMPLIFICATION

(75) Inventors: Steven Robert Jones, Milton Keynes (GB); Per-Olof Brandt, Lomma (SE)

(73) Assignee: Cambridge Silicon Radio Limited, Cambridge (GB)

( * ) Notice: Subject to any disclaimer, the term of this patent is extended or adjusted under 35 U.S.C. 154(b) by 149 days.

(21) Appl. No.: 12/147,845

(22) Filed: Jun. 27, 2008

(65) Prior Publication Data
US 2009/0322422 A1  Dec. 31, 2009

(51) Int. Cl.
*H03G 3/20* (2006.01)
(52) U.S. Cl. .................. 330/127; 330/149; 330/297
(58) Field of Classification Search .............. 330/127, 330/297, 279, 129, 134
See application file for complete search history.

(56) References Cited

U.S. PATENT DOCUMENTS

| | | | | |
|---|---|---|---|---|
| 6,148,220 A | * | 11/2000 | Sharp et al. | 455/572 |
| 6,646,501 B1 | * | 11/2003 | Wessel | 330/136 |
| 6,703,897 B2 | * | 3/2004 | O'Flaherty et al. | 330/136 |
| 7,190,221 B2 | * | 3/2007 | Henze | 330/136 |
| 7,466,195 B2 | * | 12/2008 | Drogi et al. | 330/136 |
| 2009/0081968 A1 | * | 3/2009 | Vinayak et al. | 455/110 |
| 2009/0117864 A1 | * | 5/2009 | Cassia et al. | 455/127.1 |

* cited by examiner

*Primary Examiner*—Hieu P Nguyen
(74) *Attorney, Agent, or Firm*—Fitzpatrick, Cella, Harper & Scinto

(57) ABSTRACT

An apparatus for amplifying a signal. The apparatus includes an amplifier powered by a power supply, a monitor that monitors an output signal of the amplifier and a controller operative to adjust the power supply if distortion is detected in the output signal of the amplifier by the monitor.

7 Claims, 3 Drawing Sheets

SIGNAL AMPLIFICATION

The present invention relates to apparatus for amplifying a signal. The invention is particularly applicable to RF amplifiers used in mobile communications devices.

Current mobile communications devices such as third generation mobile telephones use an RF power amplifier to increase the power of a modulated signal to an acceptable level before the signal is transmitted via an antenna. Typically, an isolator is used to match the output impedance of the RF power amplifier to the input impedance of "downstream" components such as an RF front end module, and to isolate the output of the RF power amplifier from such components to protect it from variable loads arising from the operation of such components.

Whilst this approach generally provides satisfactory results in terms of the performance of the device, it is not a particularly cost-effective solution, as the isolator is a large ferromagnetic component, which increases the bill of materials (BOM) cost of the device, and adds additional design constraints. As isolators tend to be narrowband components, these difficulties are multiplied in many cases, where devices must be able to support different frequency bands. For example, a 3G mobile telephone may be required to support three RF frequency bands, requiring three isolators.

Thus, a desire to remove the isolator from such devices exists, to reduce the BOM cost and to increase design flexibility. However, simply removing the isolator from a device gives rise to additional problems, as the RF power amplifier is exposed to the varying loads presented by the "downstream" components, and thus the RF power amplifier must be able to provide a large range of output voltages to accommodate these varying loads. This reduces the overall efficiency of the RF power amplifier, as only a proportion of the available supply voltage is required at the output of the power amplifier under normal operating conditions.

According to a first aspect of the invention, there is provided apparatus for amplifying a signal, the apparatus comprising an amplifier powered by a power supply, a monitor for monitoring an output signal of the amplifier and a controller operative to adjust the power supply if distortion is detected in the output signal of the amplifier by the monitor.

In the apparatus of the present invention there is no need to maintain an "overhead" in the voltage available at the output of the amplifier at all times, as the power supply to the amplifier is adjustable according to the output power required of the amplifier, as if distortion is detected in the output signal of the amplifier by the monitor, indicating that the available output voltage is too low, the controller is operative to adjust the power supply to the amplifier to allow the amplifier to provide the output voltage that is required to produce an undistorted output signal. Thus, the power supply to the amplifier can be maintained at or close to a minimum required to support the required output power, and the efficiency of the amplifier can be increased.

The monitor may compare the output signal of the amplifier with an input signal of the amplifier to detect distortion in the output signal.

A value of a voltage to be supplied by the power supply to the amplifier may be obtained from a look-up table by reference to the required output power.

The power supply may comprise a switch mode power supply which is adjustable by adjusting a duty cycle thereof.

The apparatus may further comprise a distorter for distorting an input signal to the amplifier to compensate for distortion of the input signal by the amplifier.

Preferably, the distorter is variable.

The distorter may be operable in the event that the maximum supply voltage that can be provided by the power supply has been reached and the monitor detects distortion in the output of the amplifier.

Additionally or alternatively, the apparatus may further comprise an attenuator for attenuating the input signal.

The attenuator may be operable in the event that the maximum supply voltage that can be provided by the power supply has been reached and the monitor detects distortion in the output of the amplifier.

According to a second aspect of the invention, there is provided a mobile communications device comprising apparatus according to the first aspect.

Embodiments of the invention will now be described, strictly by way of example only, with reference to the attached drawings, of which FIG. 1 is a schematic diagram illustrating functional blocks of a transmit path of a mobile communications device;

Figure 1:
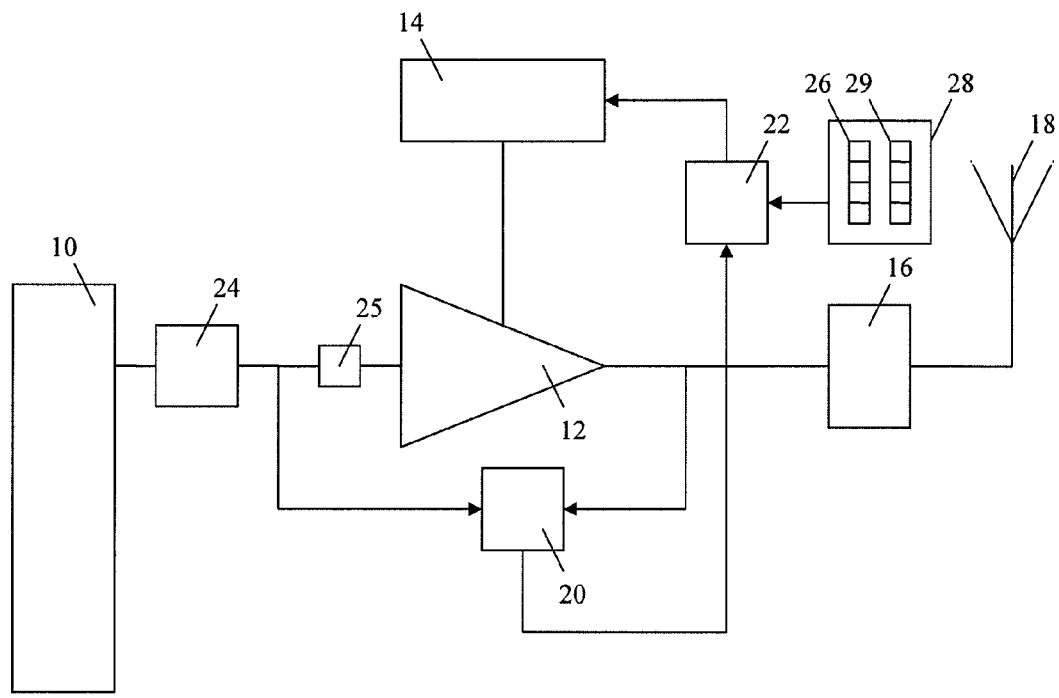

Referring first to FIG. 1, there is shown a schematic representation of functional blocks of a transmit path of a mobile telephone or other communications device. It will be appreciated that the functional blocks presented in FIG. 1 do not necessarily represent actual components of such a device, but are intended simply to illustrate distinct functions that are carried out within the device.

The device comprises a transmit/receive section 10, which has as an output a low power (typically 6-10 dBm) signal, which must be amplified before transmission. The transmit/receive section 10 may be provided as a microprocessor or as part of a microprocessor.

This low power signal is fed to an input of a power amplifier 12, which is powered by an adjustable power supply 14 such as a switch mode power supply (SMPS). The power amplifier 12 amplifies its input signal to a power level suitable for transmission (typically around 28 dBm).

An output of the power amplifier 12 is connected to an RF front end module 16, which has an output which is connected to one or more antennae 18 for transmitting the amplified signal.

A monitoring section 20 monitors the output of the power amplifier 12, and has an output which is connected to an input of a controller 22, which may be provided as part of a microprocessor in which the transmit/receive section is implemented. The controller 22 is configured to cause the adjustable power supply 14 to set the initial supply voltage $V_{cc}$ to the amplifier 12, and to cause the adjustable power supply 14 to adjust the supply voltage $V_{cc}$ if appropriate, as will be described below. Where the adjustable power supply 14 is a switch mode power supply, this adjustment of the supply voltage $V_{cc}$ may be achieved by adjusting a voltage reference of the switch mode power supply, to cause a change in a duty cycle of the switch mode power supply.

In use, the controller 22 determines the initial maximum transmitted signal power required, in accordance with the prevailing conditions of a network serving the device in a manner known in the art. This initial power requirement may vary for a number of reasons, such as the distance of the device from a base station of the network, or the amount of adjacent channel or co-channel interference in the channel allocated to the device by the network, for example.

This initial maximum transmitted signal power is used to determine the initial supply voltage $V_{cc}$ that must be supplied by the adjustable power supply 14 to the power amplifier 12 to allow the amplifier 12 to support the required output power. The value of the initial supply voltage $V_{cc}$ that is required may be directly calculated by the controller 22, or the controller 22 may consult a look-up table, stored in a memory of the device, containing a predefined list of maximum output power values and a corresponding list of supply voltage values required to support the maximum output power values.

Once the initial supply voltage $V_{cc}$ required to support the initial transmitted signal power required has been determined by the controller 22, the adjustable power supply 14 is set to supply the initial supply voltage $V_{cc}$ to the power amplifier 12. Low power signals from the transmit/receive section 10 can then be amplified, with these amplified signals being monitored by the monitoring section 20.

Figure 2:
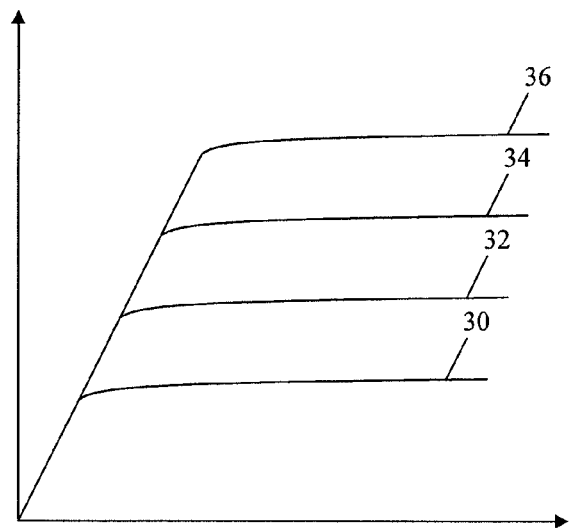
FIG. 2 is a graph illustrating the relationship between the amplitude of an output signal and that of an input signal for a typical amplifier over a range of supply voltages.

Distortion of the amplified signals output by the power amplifier 12 can occur for a number of reasons. FIG. 2 plots the amplitude of the output voltage of a typical power amplifier 12 against the amplitude of the input voltage to the amplifier, with each curve 30, 32, 34, 36 representing a different supply voltage $V_{cc}$. It can be seen from FIG. 2 that the gain (i.e. the ratio of the amplitude of the voltage of the output signal to the amplitude of the voltage of the input signal) of the power amplifier 12 for each of the different supply voltages $V_{cc}$ is linear up to a certain input voltage, after which point the gain plateaus.

The reason for this is that the theoretical maximum output voltage of a power amplifier is limited to the supply voltage. For example, the theoretical maximum peak output voltage of a power amplifier powered by a 5 volt supply is 5 volts (although the actual maximum output voltage is slightly smaller than this, due to losses within the amplifier and the like). Thus, as the amplitude of the input signal rises, the amplitude of the output signal also rises, until the input signal reaches the point at which the amplifier is saturated and its output voltage cannot rise any higher. After this saturation point, any increase in the amplitude of the input signal cannot cause an increase in the amplitude of the output signal.

Figure 3:
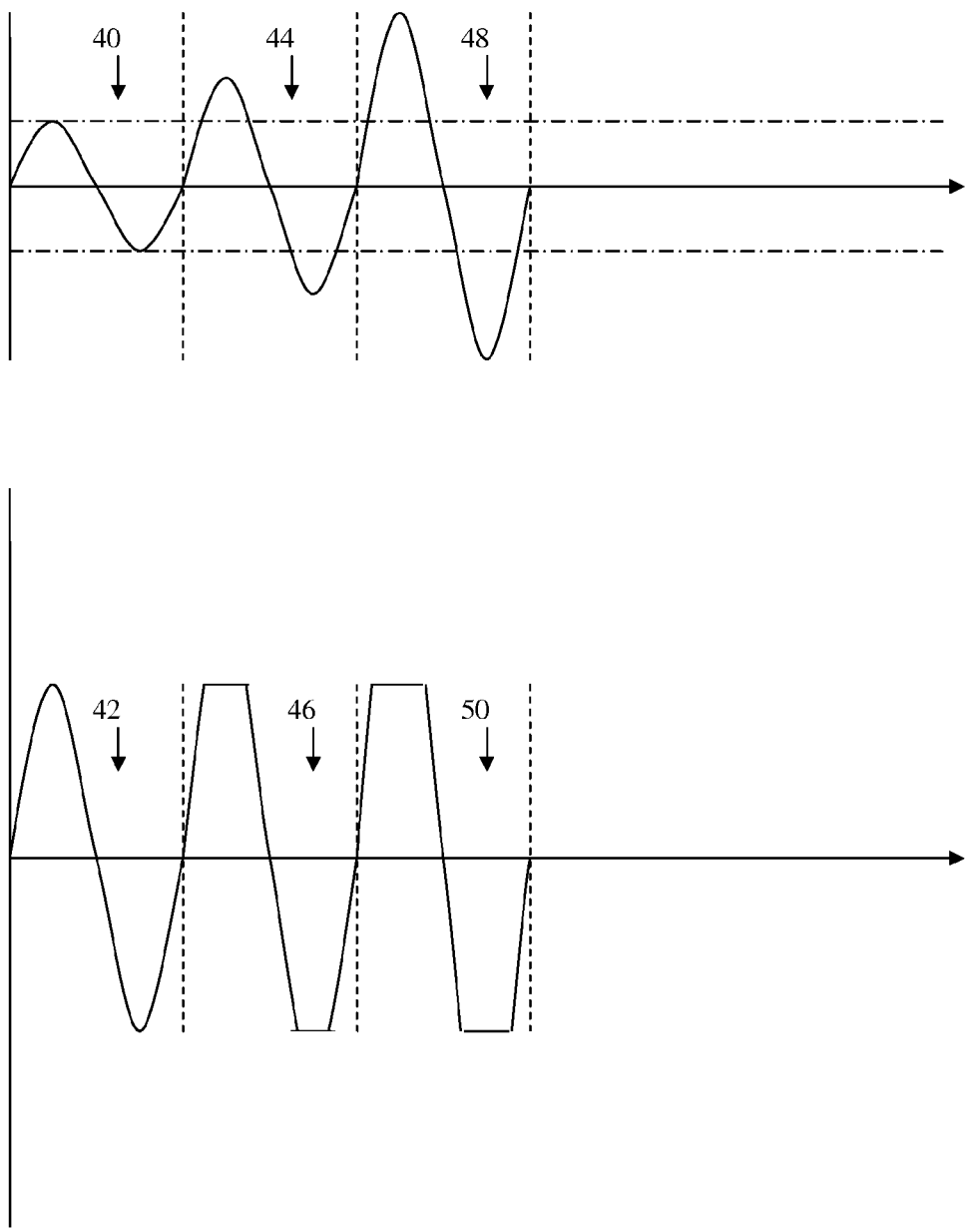
FIG. 3 shows an undistorted input signal and a distorted output signal.

Thus, if the amplitude of the input signal rises above the saturation point of the amplifier, the output signal will be clipped, as those parts of the input signal which are above the saturation point of the amplifier will result in an output signal which is limited to the maximum output voltage of the amplifier. This is illustrated in FIG. 3, which shows an input signal of varying amplitude (upper trace) and a corresponding output signal (lower trace). The dashed horizontal lines in the upper trace indicate the saturation point of the amplifier. It can be seen that as the amount by which the input signal exceeds the saturation point increases, the amount of clipping of the output signal increases. Thus, in the section indicated at 40 on the upper trace, the whole of the input signal is below the saturation point of the amplifier, and thus there is no distortion in the corresponding portion 42 of the output signal. In the section indicated at 44 in the upper trace, part of the input signal exceeds the saturation point, and the corresponding part 46 of the output signal is clipped, resulting in a flat top to the output signal. In the section indicated at 48 of the upper trace, even more of the input signal exceeds the saturation point, causing more pronounced clipping of the corresponding part 50 of the output signal.

Thus, distortion of the output signal of the amplifier 12 may arise if the amplitude of the signal from the transmit/receive section 10 exceeds the saturation point of the amplifier at the supply voltage $V_{cc}$ at which it is operating.

It will be appreciated from FIG. 2 that as the supply voltage to the amplifier 12 increases, the saturation point increases. For example, in FIG. 2, curve 30 represents a lower supply voltage than curve 32, whilst curve 32 represents a lower supply voltage than curve 34, and so on. The point at which the curve ceases to be linear is further to the right for each successive curve 30, 32, 34, 36, indicating that the saturation point is higher as the supply voltage increases.

This property of the amplifier 12 is exploited in the present embodiment to reduce distortion of the amplified output signal whilst also improving the efficiency of the amplifier 12.

The monitoring section 20 is configured to detect distortion in the amplified signal output by the amplifier. This detection of distortion may be achieved in a variety of ways, an example of which will be described below, with reference to FIG. 4.

In the example shown in FIG. 1, the input to the amplifier 12 is a phase modulated signal representing a polar modulation of a Cartesian modulation of a data symbol to be transmitted, and this phase modulated signal is to be amplitude modulated by the amplifier 12, by adjustment of the supply voltage $V_{cc}$ to the amplifier 12 in accordance with the symbol to be transmitted, as will be familiar to those skilled in the art. The input signal is monitored by the monitoring section 20, which compares the input signal to the output signal of the amplifier 12.

Figure 4:
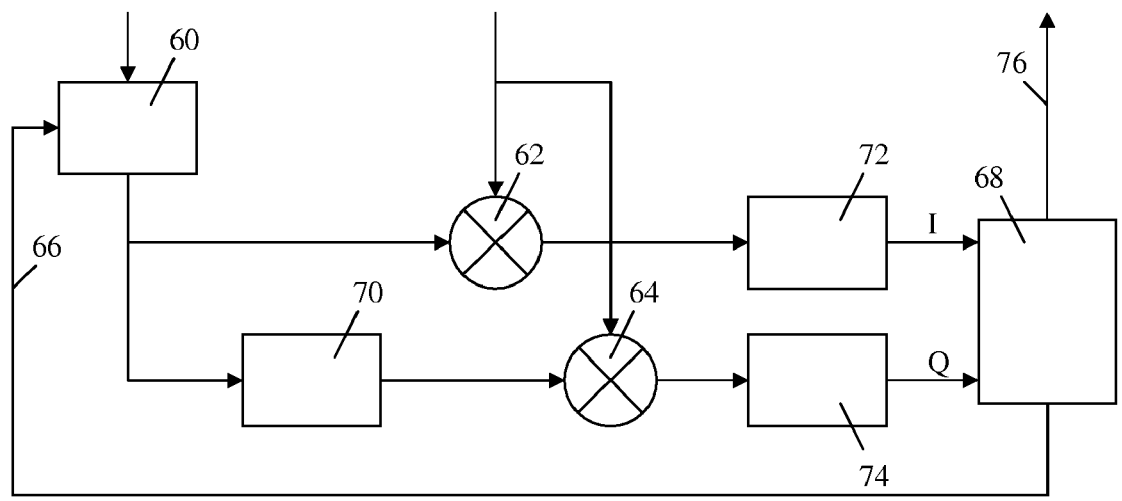
FIG. 4 is a schematic representation of a monitoring section for detecting distortion in an output signal of an amplifier.

Referring now to FIG. 4, the monitoring section 20 includes a switchable phase inverter 60, which receives as an input a proportion of the power of the phase modulated carrier signal that is the input to the amplifier 12. Mixers 62 and 64 receive a proportion of the power of the phase and amplitude modulated signal that is the output of the amplifier 12. The phase inverter 60 is switched between two states by a control input 66 from a processor 68. In one state, the phase inverter 60 has no effect on its input signal, but in the other state, the phase inverter 60 imposes a 180° phase shift on its input signal. The output of the phase inverter 60 is then supplied to mixer 62 and, via a 90° phase shifter 70, to mixer 64. It will be apparent to the skilled person that mixers 62 and 64 and phase shifter 70 together constitute a downconverter for quadrature downconverting the portion of the output signal of the amplifier 12. The output of mixer 62 provides the I component of this downconversion process, whilst the output of mixer 64 provides the Q component of this downconversion process. These I and Q signals are then converted into digital signals by analogue to digital converters (ADCs) 72 and 74. Accordingly, ADCs 72 and 74 produce a stream of IQ symbols which are inputted to the processor 68.

If the amplifier 12 were perfect then the I and Q symbols presented to the processor 68 by ADCs 72 and 74 would represent precisely the amplitude components of the Cartesian modulation symbol that is currently being transmitted. The processor 68 can detect any departure from this ideal relationship in the I and Q symbols arriving from ADCs 72 and 74 and can use this information to quantify any distortion in the output signal of the power amplifier 12. This information can be passed to the controller 22, which can calculate a new value for the supply voltage $V_{cc}$, which supply voltage will enable the amplifier 12 to produce an output signal containing no distortion or a minimal amount of distortion. Once the controller 22 has calculated this new value for the supply voltage, it causes the power supply 14 to adjust its output voltage to the required value, for example by adjusting the voltage reference and thus increasing the duty cycle of the adjustable power supply 14, in the case of a switch mode power supply. Thus, the amplifier 12 is brought back into a linear gain mode of operation and the distortion in the output signal is eliminated or reduced.

In one example, the controller 22 uses one or more look up tables 26, 29 to calculate the new value for the supply voltage $V_{cc}$. The use of look up tables enables an optimum value of the new supply voltage $V_{cc}$ to be used, such that the overhead in the available output voltage of the amplifier 12 is always at a minimum required to support the required output power, so as to maximise the efficiency of the device.

A first look up table 26 is provided in a memory 28 of the device, listing desired output power values and the corresponding values of the supply voltage $V_{cc}$ required to support the desired output power values. However, as the supply voltage $V_{cc}$ of the amplifier 12 affects the gain of the amplifier 12, a second look up table 29 is provided in the memory of the device, which look up table 29 lists the values of the supply voltage $V_{cc}$ stored in the first look up table 26 against the gain of the amplifier 12 at those supply voltage values. Additionally, the operating mode of the amplifier 12 affects the gain. Typically the amplifier 12 may have a low-power operating mode in which its quiescent operating current is low, and a high-power operating mode in which the quiescent operating current is higher. Thus, a look up table is required for each of the operating modes, listing the values of the supply voltage $V_{cc}$ against the gain of the amplifier 12 at those supply voltage values. In this way, the supply voltage $V_{cc}$ required to support a given output power can be determined, and the gain of the amplifier 12 at that supply voltage can be determined, thus ensuring that the input signal can be configured correctly to obtain the required output power. Thus, when a desired output power is selected, in accordance with the prevailing network or propagation channel conditions, for example, the first look up table 26 may be consulted to determine the supply voltage Vcc required to support the desired output power. Having determined the required supply voltage Vcc, the second look up table 29 may be consulted to determine the value of the gain of the amplifier 12 at that supply voltage $V_{cc}$. This gain value can be used to determine whether, and by how much, the input signal must be scaled to ensure that the desired output power is achieved at the supply voltage $V_{cc}$ and gain value which have been determined from the first and second look up tables 26, 29.

The look up tables 26, 29 may be updated periodically with new supply voltage and amplifier gain values, based on observations or measurements of the performance of the amplifier 12 and the associated components, to compensate for changes in the amplifier 12 caused by aging and the like. When a value in a look up table is updated, neighbouring values may also be updated to reflect the change, to ensure that changes in the output power produced by the amplifier 12 occur smoothly, rather than in large steps.

The apparatus 10 may also include a pre-distorter (shown at 24 in FIG. 1) for pre-distorting the input signal to the amplifier 12 to compensate for distortion introduced by the amplifier 12, as is well known in the art. In the event that the power supply 14 is unable to supply a sufficiently high supply voltage $V_{cc}$ to reduce the distortion in the output signal to a satisfactory level, the pre-distorter may be used to apply distortion to the input signal to the amplifier 12 to counteract the distorting effect of the amplifier 12 on the input signal, as will be familiar to those skilled in the art. The amount of pre-distortion applied to the input signal may vary depending upon the amount of distortion detected in the output signal by the monitoring section.

In the event that the monitoring section 20 detects an unacceptable amount of distortion in the amplified modulated output signal when the supply voltage $V_{cc}$ of the amplifier 12 is at the maximum that can be provided by the adjustable power supply 14, and the amount of pre-distortion applied to the input signal is at the maximum that can be applied by the pre-distorter, the controller 22 may reduce the input power to the amplifier 12 by attenuating the input signal, thus reducing the required output power to a level where the required output power can be supported by the amplifier 12 without distortion of the amplified modulated output signal. In this case the power of the signal transmitted by the device may be less than is ideal for the prevailing network conditions, but the lack of distortion of the transmitted signal may compensate for this reduced signal strength. It will be appreciated by those skilled in the art that various means may be used to attenuate the input signal. For example, one or more switchable or variable attenuators may be provided at the input to the amplifier 12.

In use, the monitoring section 20 may also monitor the output signal of the amplifier 12, to detect whether the supply voltage $V_{cc}$ of the amplifier 12 can be reduced. Thus, if it is detected that the maximum amplitude of the output signal is significantly lower than the supply voltage $V_{cc}$ of the amplifier 12, indicating that there is an unnecessarily large overhead in the maximum output voltage of the amplifier 12, in other words that the supply voltage $V_{cc}$ is greater than that required to support the output power required of the amplifier 12, the supply voltage $V_{cc}$ of the amplifier 12 may be reduced, for example by reducing the voltage reference in the case where the power supply 14 is a switch mode power supply, to reduce the duty cycle of the switch mode power supply. Reducing the supply voltage $V_{cc}$ of the amplifier in this way improves the efficiency of the amplifier, as the unnecessary overhead in the output voltage of the amplifier 12 is eliminated. Of course, if distortion is subsequently detected in the output signal, the supply voltage $V_{cc}$ can be increased to support the required output power.

It will be apparent to those skilled in the relevant art that the monitoring section 20 described above is merely one example of a system for detecting distortion of the output signal of the amplifier 12, and that alternative systems may be appropriate, particularly where the input signal is in a different form, such as where a different modulation scheme is used.

By employing closed-loop control of the supply voltage $V_{cc}$ of the amplifier 12 in this way, the efficiency of the amplifier 12, and thus of a device such as a mobile telephone incorporating the amplifier 12, can be improved in comparison to known amplifiers and devices.

Although the invention has been described in the context of the transmit path of a mobile communications device, it will be appreciated that the invention is equally applicable to other fields in which efficiency and linearity of amplifiers are important.

The invention claimed is:

1. Apparatus for amplifying a signal, the apparatus comprising an amplifier powered by a power supply, a monitor for monitoring an output signal of the amplifier and a controller operative to adjust the power supply if distortion is detected in the output signal of the amplifier by the monitor, wherein the apparatus further comprises a distorter for distorting an input signal to the amplifier to compensate for distortion of the input signal by the amplifier, and an attenuator for attenuating the input signal, the attenuator being operable in the event that a maximum supply voltage that can be provided by the power supply has been reached and the monitor detects distortion in the output of the amplifier.

2. Apparatus according to claim 1 wherein the monitor compares the output signal of the amplifier with an input signal of the amplifier to detect distortion in the output signal.

3. Apparatus according to claim 1 wherein a value of a voltage to be supplied by the power supply to the amplifier is obtained from a look-up table by reference to required output power.

4. Apparatus according to claim 1 wherein the distorter is variable.

5. Apparatus according to claim 1 wherein the distorter is operable in the event that the maximum supply voltage that can be provided by the power supply has been reached and the monitor detects distortion in the output of the amplifier.

6. Apparatus according to claim 1 wherein the power supply comprises a switch mode power supply which is adjustable by adjusting a duty cycle thereof.

7. A mobile communications device comprising an apparatus according to claim 1.

* * * * *